(12) United States Patent
Yao et al.

(10) Patent No.: US 8,823,361 B2
(45) Date of Patent: Sep. 2, 2014

(54) ELECTRICAL CURRENT SENSOR DEVICE

(75) Inventors: Ming gao Yao, DongGuan (CN); Koyu Yamanoi, Hong Kong (CN); Wei Xiong, Santa Clara, CA (US)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 429 days.

(21) Appl. No.: 13/245,955

(22) Filed: Sep. 27, 2011

(65) Prior Publication Data

US 2013/0008022 A1    Jan. 10, 2013

(30) Foreign Application Priority Data

Jul. 4, 2011  (CN) .......................... 2011 1 0185592

(51) Int. Cl.
*G01R 15/20* (2006.01)
*G01R 33/09* (2006.01)
*H05K 1/18* (2006.01)

(52) U.S. Cl.
CPC .............. *G01R 33/09* (2013.01); *G01R 33/091* (2013.01); *H05K 2201/10151* (2013.01); *H05K 1/182* (2013.01); *G01R 15/205* (2013.01)
USPC ................................... 324/117 H; 324/117 R

(58) Field of Classification Search
CPC .. G01R 15/202; G01R 15/205; G01R 15/207; G01R 19/0092; G01R 33/09
USPC ....................................................... 324/117 H
See application file for complete search history.

(56) References Cited

U.S. PATENT DOCUMENTS

| | | | | |
|---|---|---|---|---|
| 4,464,625 A | * | 8/1984 | Lienhard et al. | 324/117 R |
| 4,794,243 A | * | 12/1988 | Hamada | 235/492 |
| 5,933,003 A | * | 8/1999 | Hebing et al. | 324/117 R |
| 7,327,032 B2 | * | 2/2008 | Yoon | 257/737 |
| 2006/0162957 A1 | * | 7/2006 | Kindermann et al. | 174/255 |
| 2012/0187943 A1 | * | 7/2012 | Ausserlechner et al. | 324/244 |
| 2012/0306487 A1 | * | 12/2012 | Yao et al. | 324/252 |

* cited by examiner

*Primary Examiner* — Richard Isla Rodas
(74) *Attorney, Agent, or Firm* — Nixon & Vanderhye PC

(57) ABSTRACT

An electrical current sensor device includes a first printed circuit board assembly, a second printed circuit board assembly positioned opposite to the first printed circuit board assembly, and a holder holding the first and second printed circuit board assemblies and providing a passage to allow an electrical conductor to pass through. The first printed circuit board assembly includes a first sensing circuit having a first element pair that includes two magnetoresistive elements with a first pinning direction, the second printed circuit board assembly comprises a second sensing circuit with a second element pair that includes having two magnetoresistive elements with a second pinning direction that is opposite to the first pinning direction, and the first and second pinning directions are perpendicular to a current direction of a current passing through the electrical conductor, the first sensing circuit electrically connects with the second sensing circuit to form a Wheatstone bridge circuit.

8 Claims, 8 Drawing Sheets

ELECTRICAL CURRENT SENSOR DEVICE

This application claims the benefit of Chinese Patent Application No. 201110185592.5, filed on Jul. 4, 2011, the entire content of which is hereby incorporated by reference in this application.

FIELD OF THE INVENTION

The present invention relates to an electrical current sensor device and, more particularly, to an electrical current sensor device with a first sensing circuit and a second sensing circuit which can sense the external magnetic field at two opposite directions, thereby eliminating the external magnetic field affect and improving the measurement accuracy.

BACKGROUND OF THE INVENTION

Many types of electrical current sensors are known and are in wide use today throughout the electronics industry. Commonly, many of these sensors include a Hall effect generator that senses the magnetic field associated with an electrical current and, in turn, produces a Hall effect output voltage that is proportional to the magnetic field.

Hall effect generators generally comprise a layer of homogeneous semiconductor material, known as the Hall plate, constructed upon a dielectric substrate. An excitation current is applied to the Hall plate, when the Hall effect generator is placed in a magnetic field and supplied with excitation current, the Hall effect output voltage is produced in the Hall plate which is orthogonal to the magnetic field and the excitation current, and then the output voltage is measured out.

Various types of sensing device utilizing the Hall effect phenomena have been used in the past, as disclosed in U.S. Pat. No. 5,416,407. As shown in FIG. 1, the electrical current sensor 100 comprises an amplifier 102, a constant current source 104, a gapped toroid core (not shown) mounted on the component side of a printed circuit board (PCB) (not shown), a Hall effect generator 106 extending via its output leads from the PCB into the gap of the toroid core, and an inductive loop 108 positioned at the edge of the gap of the toroid core. Concretely, the Hall effect generator 106 comprises a standard design having a semiconductor Hall plate (not shown) mounted onto a dielectric substrate (not shown) within a sealed package with its constant current leads 112 and the Hall effect output voltage leads 114 extending therefrom.

During operation, an electrical conductor is inserted through a hole in the PCB. As electrical current flows through the conductor, a magnetic field is created within the toroid core and across the gap of the toroid core. The Hall effect generator 106 and the inductive loop 108 are therefore subjected to the magnetic field. The constant current source 104 supplies a temperature-compensated constant current to the Hall plate. As a result, the Hall effect generator 106 produces an output voltage that is proportional to the magnetic field concentrated onto its Hall plate, and this output voltage is then supplied to the amplifier 102 to be amplified to a useful level, finally an electrical current can be detected.

However, the signal of the output voltage of the above-mentioned electrical current sensor 100 is lower, and the measurement accuracy is poor. Moreover, the sensitivity of the Hall element in the Hall effect generator 106 is insufficient due to the alternating and transient current.

Thus, there is a need for an improved electrical current sensor device to overcome the above drawbacks.

SUMMARY OF THE INVENTION

One aspect of the present invention is to provide an electrical current sensor device, which can sense the external magnetic field at two opposite directions, thereby cancelling the external magnetic field affect to the measurement and improving the measurement accuracy.

Another aspect of the present invention is to provide a method for bonding a circuit module to a printed circuit board, which can simplify the manufacturing process and reduce the thickness of the device.

To achieve above objectives, an electrical current sensor device of the present invention includes a first printed circuit board assembly, a second printed circuit board assembly positioned opposite to the first printed circuit board assembly, and a holder holding the first and second printed circuit board assemblies and providing a passage to allow an electrical conductor to pass through. The first printed circuit board assembly includes a first sensing circuit having at least one first element pair that includes two magnetoresistive elements with a first pinning direction, the second printed circuit board assembly includes a second sensing circuit having at least one second element pair that includes two magnetoresistive elements with a second pinning direction that is opposite to the first pinning direction, and the first and second pinning directions are perpendicular to a current direction of a current passing through the electrical conductor, the first sensing circuit electrically connects with the second sensing circuit.

Preferably, the first element pair and the second element pair are symmetrically located at two sides of the electrical conductor.

As a preferable embodiment, the first sensing circuit further comprises a third element pair electrically connecting with the first element pair, and the third element pair comprises two magnetoresistive elements with the second pinning direction; the second sensing circuit further comprises a fourth element pair electrically connecting with the second element pair, and the fourth element pair comprises two magnetoresistive elements with the first pinning direction.

Preferably, the third element pair and the fourth element pair are symmetrically located at two sides of the electrical conductor.

Preferably, two slots are formed on the inner wall of the holder, and the first and second printed circuit boards are accommodated in the slots.

Preferably, a first through slot is formed through the first printed circuit board assembly, and a second through slot is formed through the second printed circuit board assembly, the first sensing circuit is packaged and embedded in the first through slot, and the second sensing circuit is packaged and embedded in the second through slot.

Preferably, the electrical current sensor device further includes a shielding cover covering on the holder to protect the first and second sensing circuits.

More preferably, the electrical current sensor device further includes a display device formed on the shielding cover and electrically connects with the first and second printed circuit board assemblies.

A method for bonding a circuit module to a printed circuit board of the present invention includes forming a slot on the printed circuit board; inserting the circuit module into the slot; and bonding the edges of the slot and the circuit module.

Preferably, the method further includes forming several first pads on the printed circuit board; forming several second pads on the circuit module; and bonding the first pads and the second pads.

Preferably, the slot is a through slot or a recessed slot.

Preferably, the depth of the slot is the same with or larger than the thickness of the circuit module.

In comparison with the prior art, firstly, the present invention applies the magnetoresistive elements for replacing the Hall effect generator, the sensitivity of the magnetoresistive elements is higher than the Hall element. Secondly, as the first and second sensing circuits are located at two sides of the electrical conductor and have two opposed pinning directions, thus they can sense the same external magnetic field in two opposed directions, therefore the voltage outputs with two opposed directions of the sensed magnetic field are counteracted each other, which can cancel the external magnetic field affect and, in turn improve the measurement accuracy. Moreover, the first and second sensing circuits are embedded in the slot formed on the PCB, thereby reducing the total height of the device, which is propitious to the compact structure and design of the current electronic products.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings:

FIG. 6b is an exploded view of the electrical current sensor device shown in FIG. 6a;

DETAILED DESCRIPTION OF ILLUSTRATED EMBODIMENTS

Figure 1:
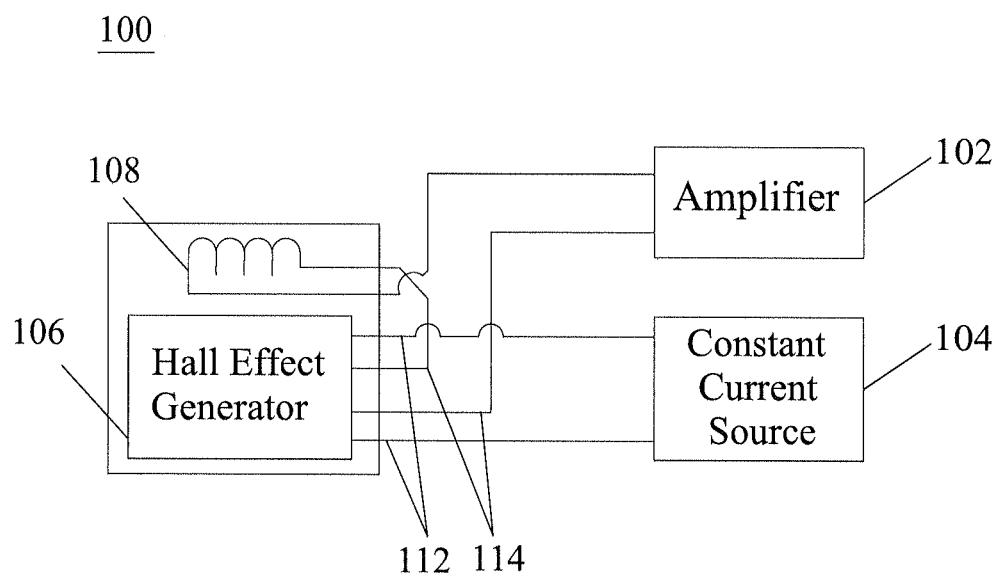
FIG. 1 is a block diagram of a conventional the electrical current sensor.

Various preferred embodiments of the invention will now be described with reference to the figures, wherein like reference numerals designate similar parts throughout the various views. As indicated above, the invention is directed to an electrical current sensor device which can sense the external magnetic field at two opposite directions, thereby eliminating the external magnetic field affect to the measurement and, in turn improving the measurement accuracy of the electrical current.

Figure 2A:
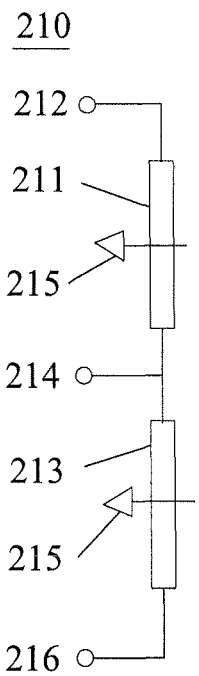
FIGS. 2a-2b is two structure views of a first and second sensing circuits according to one embodiment of the present invention.
Figure 2B:
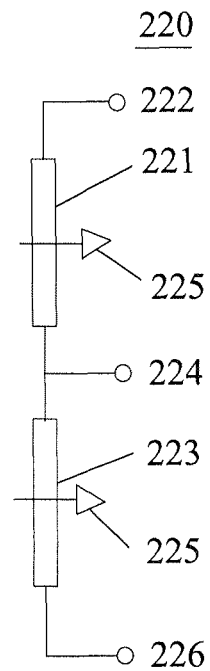

FIGS. 2a-2b show the structure view of the first and second sensing circuits according to an embodiment of the present invention. As shown in FIG. 2a, the first sensing circuit 210 includes a first element pair that has two magnetoresistive elements 211, 213 connected together, and three terminals 212, 214, 216 are formed. As shown in FIG. 2b, the second sensing circuit 220 includes a second element pair that has two magnetoresistive elements 221, 223 connected together, and three terminals 222, 224, 226 are formed. In the present invention, the magnetoresistive element can be such as giant magnetoresistive (GMR) elements, tunnel magnetoresistive (TMR) or anisotropic magnetoresistive (AMR). In this embodiment, the magnetoresistive element is GMR element.

Figure 3:
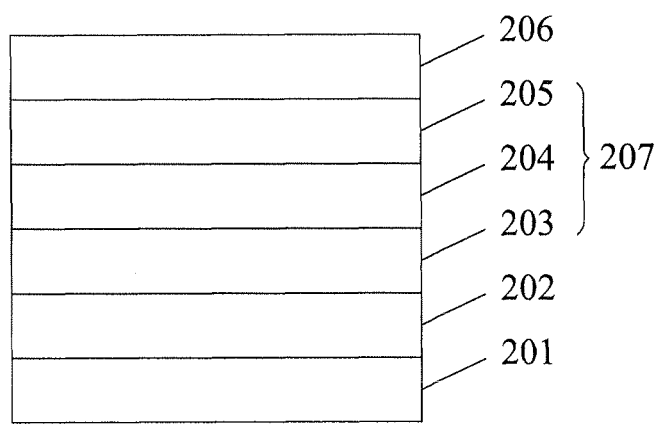
FIG. 3 is a structure view of the GMR element of the first and second sensing circuits shown in FIGS. 2a-2b.

FIG. 3 shows the structure of the GMR element, which includes a substrate layer 201, a buffer layer 202, a fixed layer 207 and a capping layer 206 laminated in turns. Concretely, the fixed layer 207 includes a pinning layer 205 for pinning the magnetization direction in a fixed direction, a free layer 203 with a magnetization direction that varies with an external magnetic field, and a space layer 204 sandwiched between the pinning layer 205 and the free layer 203 serving as a non-magnetic electric conductor. As known, the resistance of the GMR element varies with the angle between the pinning direction of the pinning layer 205 and the magnetization direction of the free layer 203. And when the GMR element locates in an external magnetic field, the direction of the free layer 203 will change depending on the external magnetic field, that is, the angle between the pinning direction of the pinning layer 205 and the magnetization direction of the free layer 203. As a result, the resistance of the GMR element changes, which causes an output voltage to generate.

Now the detailed structure of the first and second sensing circuits 210, 220 is described as following. Referring to FIGS. 2a-2b again, the GMR elements 211, 213 have a first pinning direction 215, and the GMR elements 221, 223 have a second pinning direction 225 that is opposite to the first pinning direction 215. The first and second circuits 210, 220 will be embedded in two printed circuit boards respectively and electrically connect with each other to form a Wheatstone bridge circuit (not shown). Concretely, the terminal 212 electrically connects with the terminal 222 to form an input terminal, the terminal 216 electrically connects with the terminal 226 to form another input terminal (for example it can be a grounding terminal), and the terminals 214, 224 are severed as two output terminals.

Figure 4:
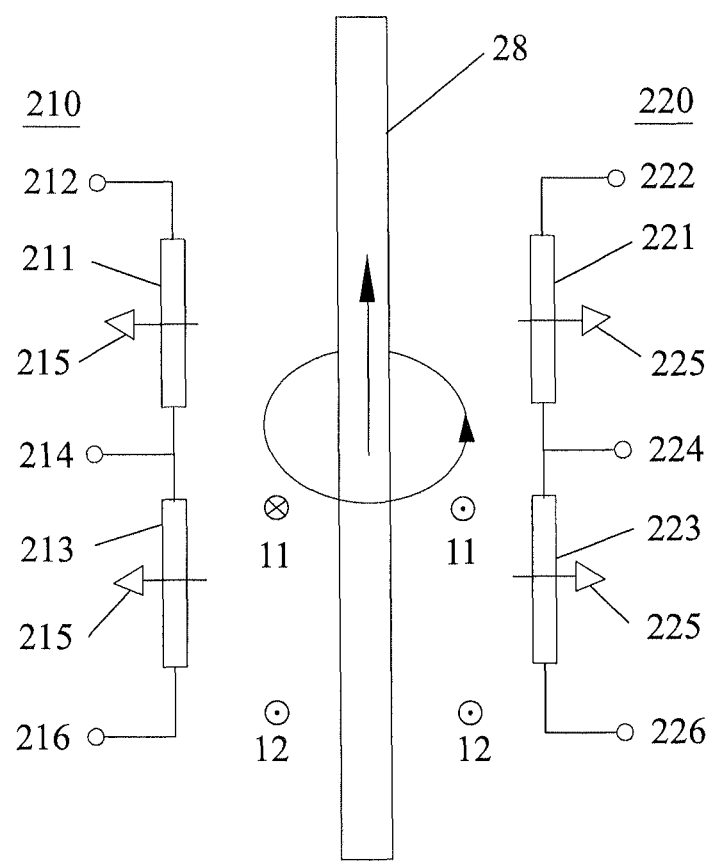
FIG. 4 is a simplified view that shows the first and second sensing circuits operate.

As show in FIG. 4, the first sensing circuit 210 and the second sensing circuit 220 are located face to face, and a current-carrying electrical conductor 28 is positioned between the two sensing circuits 210, 220, which will be explained hereinafter. Specifically, the first and second pinning directions 215, 225 are perpendicular to the current direction of the current on the current-carrying electrical conductor 28 in X-Z plane. More specifically, the first sensing circuit 210 and the second sensing circuit 220 are symmetrically located at both sides of the current-carrying electrical conductor 28. When an input source Vcc is inputted from the input terminals 212, 222 and 216, 226, the first and the second sensing circuits 210, 211 sense the magnetic field with direction 11 generated around the current-carrying electrical conductor 28 respectively.

Concretely, the potential output at output terminal 214 of the first sensing circuit 210 is $$V1 = Vcc \times \frac{\Delta R}{R};$$

the potential output at output terminal 224 of the second sensing circuits 220 is $$V2 = -Vcc \times \frac{\Delta R}{R}.$$

The total deferential output from the Wheatstone bridge circuit formed by the first sensing circuit 210 and the second sensing circuit 220 is $$V = V1 - V2 = 2Vcc \times \frac{\Delta R}{R}.$$

If there is an external magnetic field with a direction indicated by 12 around or near the first and the second sensing circuits 210, 220 except the magnetic field generated by the current-carrying electrical conductor 28, a noise V1*n* and V2*n* will be generated on the GMR elements due to the external magnetic field affect, and thus the noise can be detect in the terminals 212, 222 and 216, 226. Since the resistance values of the GMR element in the first sensing circuit 210 and the second sensing circuit 220 are the same and their pinning directions are opposed, thus, the noise V1*n* and V2*n* detected by the first sensing circuit 210 and the second sensing circuit 220 will have the same direction and the same value, thus the total noise output will be V=V1*n*−V2*n*=0. Thus, this external noise will be automatic cancelled by the system that includes the first sensing circuit 210 and the second sensing circuit 220, thus the measurement accuracy to the current on the current-carrying electrical conductor 28 is improved with the external magnetic field affect eliminated.

Figure 5A:
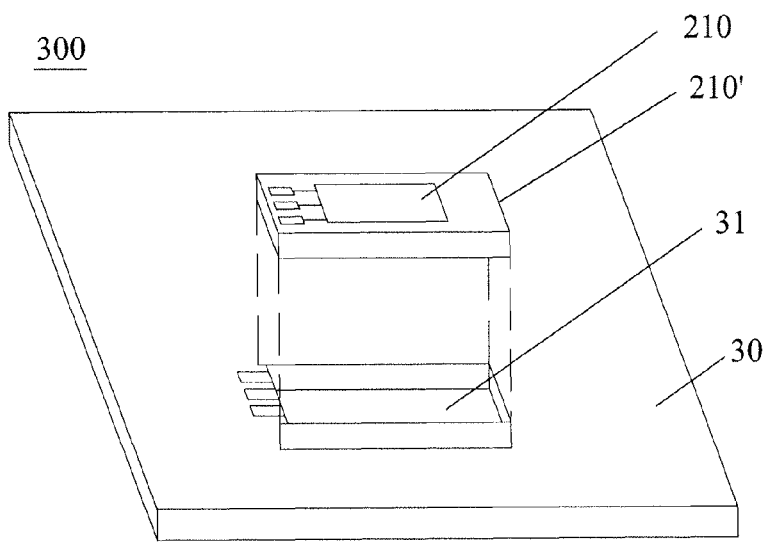
FIG. 5a is a simplified view of a printed circuit board and a package of the first sensing circuit before bonding.

Before the first and second sensing circuits 210, 220 embedded in the PCB, they will be laminated in an encapsulation 210' as shown in FIG. 5a. As the structures and the configurations of the first sensing circuit 210 and the second sensing circuit 220 are similar, thus only the first sensing circuit 210 is described specifically here. As shown in FIG. 5a, the detailed elements of the first sensing circuit 210 are omitted, and three pads are illustrated for the terminals 212, 214, 216.

Figure 5B:
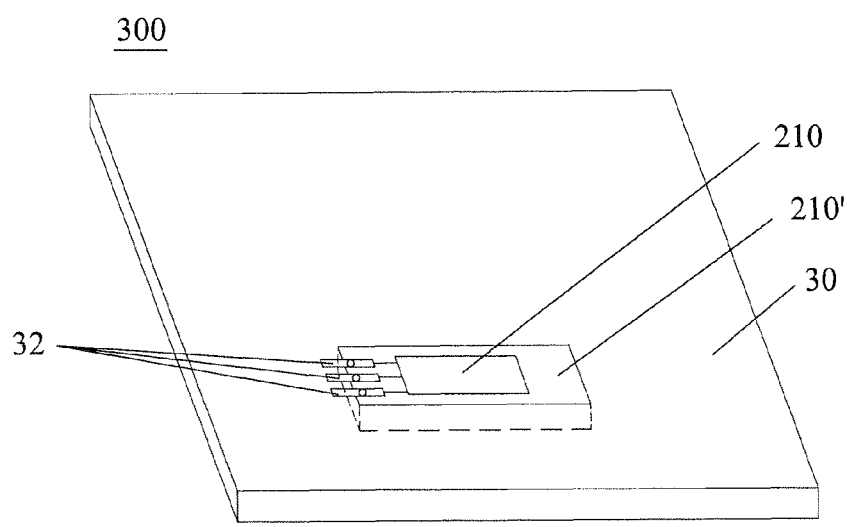
FIG. 5b a simplified view of the printed circuit board and the package of the first sensing circuit after bonding.

Referring to FIGS. 5a-5b, these figures show how the encapsulated first sensing circuit 210 is mounted on the PCB 30 to form a printed circuit board assembly (PCBA) 300. The PCB 30 includes an analog-to-digital converter (not shown) and a central processing unit (CPU) (not shown) connecting. As shown, a slot 31 is formed through the PCB 30, which has a corresponding shape and size with the encapsulation 210' of the first sensing circuit 210. In this embodiment, the slot 31 is a through slot. Concretely, the depth of the slot 31 is the same with or larger than the thickness of the encapsulation 210'. Then the encapsulation 210' is inserted into the slot 31 and bonded together by epoxy. Alternatively, several pads 32 are formed on the surface of the PCB 30 near the slot 31, so as to bond the pads on the encapsulation 210' by soldering or wire bonding, for example. Therefore, the encapsulation 210' of the first sensing circuit 210 is embedded in the PCB 30 and in the same plane with the PCB 30, thus compared with the surface mounted technology of the prior art, this bonding method is improved to reduce the total thickness of the module.

Alternatively, the slot 31 may be a recessed slot formed on the PCB 30, which has a corresponding shape and size with the encapsulation 210' of the first sensing circuit 210. Similarly, the depth of the recessed slot is the same with or larger then the thickness of the encapsulation 210'. Then the encapsulation 210' is inserted into the recessed slot and bonded together by epoxy. Therefore, the encapsulation 210' of the first sensing circuit 210 is embedded in the PCB 30 and in the same plane with the PCB 30, thus the total thickness of the PCBA 300 reduced compared with the surface mounted technology of the prior art.

Figure 6A:
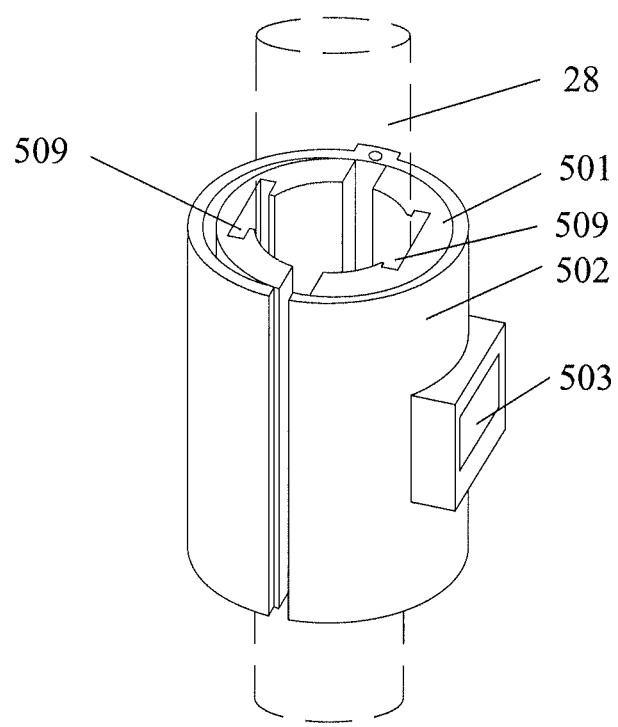
FIG. 6a is a perspective view of an electrical current sensor device according to one embodiment of the present invention.
Figure 6B:
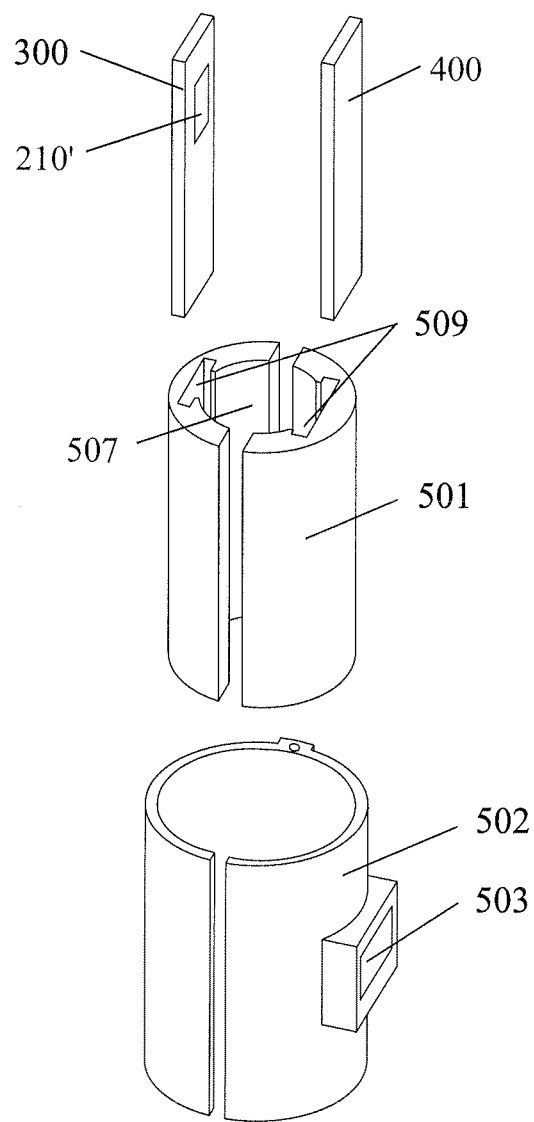

FIGS. 6a-6b show an electrical current sensor device according to one embodiment of the present invention. As shown, the electrical current sensor device 500 includes the first PCBA 300 and the second PCBA 400, a holder 501 for holding the PCBA 300 and PCBA 400, a shielding cover 502 covering on the holder 501 for protection and preventing the damage, and a display device 503 formed on the shielding cover 502 and connected with the PCBA 300 and PCBA 400. Concretely, the holder 501 is in a column shape and a passage 507 is provided to allow the current-carrying electrical conductor 28 to pass through. More concretely, the holder 501 made of ceramic material or plastic material, and the holder 501 can be separated into two pieces, alternatively it can be an integrated unity. And the shielding cover 502 is made of plastic material or stainless steel material and in a column shape according to the holder 501. Two slots 509 are formed on the inner wall of the holder 501 for accommodating the PCBA 300 and the PCBA 400. Concretely, the two slots 509 are located on the same center line of the holder 501, that is, the two slots 509 are positioned face to face, so that the PCBA 300 with the first sensing circuit 210 and the PCBA 400 with the second sensing circuit 220 are also positioned face to face with symmetrically located at two sides of the current-carrying electrical conductor 28. In a preferable embodiment, the first sensing circuit 210 and the second sensing circuit 220 are located on the same center line of the holder 501.

When the current-carrying electrical conductor 28 is positioned on the passage 507 of the holder 501, the first sensing circuit 210 and the second sensing circuit 220 with two opposed pinning directions 215, 225 senses the magnetic field induced by the current on the current-carrying electrical conductor 28 simultaneously. As the first and second sensing circuits 210, 220 are symmetrically located at two sides of the current-carrying electrical conductor 28 and have two opposed pinning directions 215, 225, thus they can sense the same magnetic field in two opposed directions (referring to FIG. 4), since the first and second sensing circuits 210, 220 are connected to form a Wheatstone bridge circuit, therefore the final differential output is proportional to the magnetic field which is generated by the current-carrying electrical conductor 28, after converted and calculated by the converter and CPU of the PCBA 300 and PCBA 400, and the current value is finally displayed on the display device 503.

Within the contemplation of the present invention, when an external magnetic filed exists around the electrical current sensor device 500, the resistance of the GMR elements in the first and second sensing circuits 210, 220 also varies with the external magnetic field, which causes two noise signal output voltages with the same direction in the first and second sensing circuits 210, 220. As explained above, since the first and second sensing circuits 210, 220 are electrically connected together with a Wheatstone bridge circuit, thus the final differential noise signal output voltage is eliminated and its value is zero. Thus, the measurement accuracy of the current on the current-carrying electrical conductor 28 is improved with the external magnetic field affect eliminated.

Figure 7:
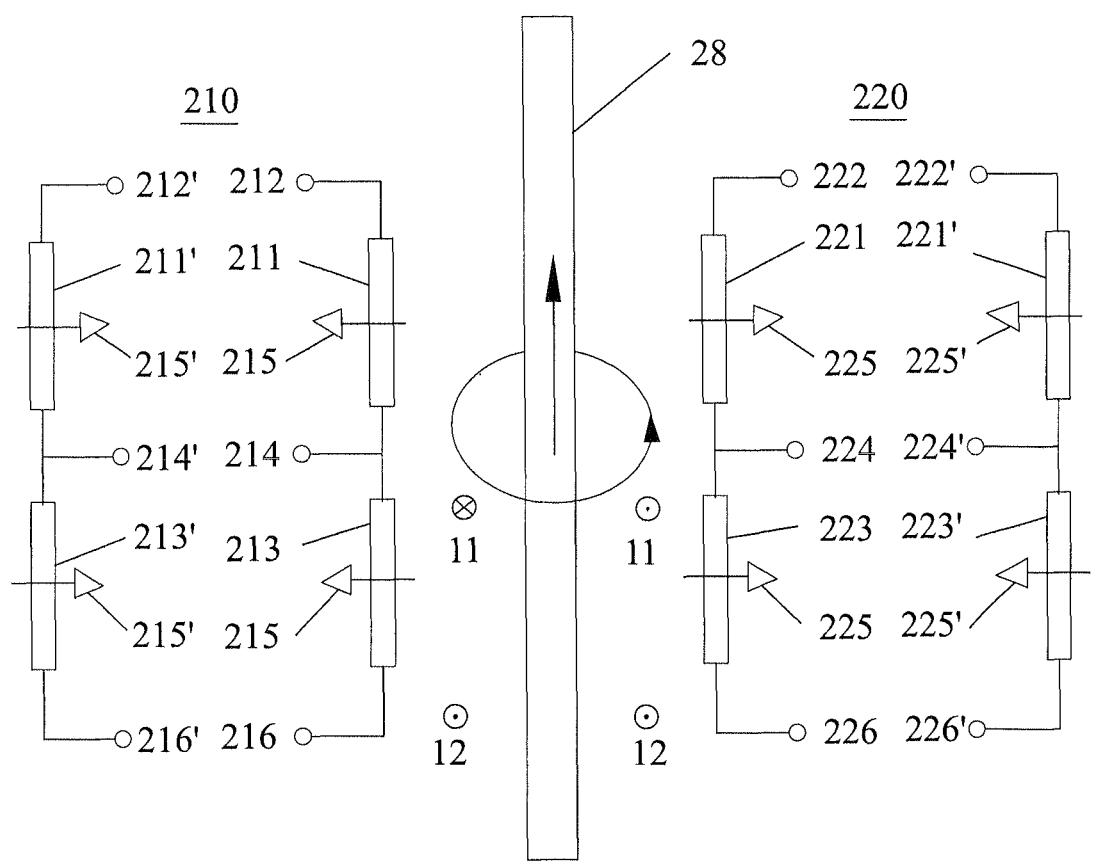
FIG. 7 shows the first and second sensing circuits according another embodiment of the present invention, and shows their operation status.

FIG. 7 is another embodiment of the first and second sensing circuits of the this invention, the first sensing circuit 210 further includes a third element pair electrically connecting with the first element pair to form a first Wheatstone bridge circuit, and the third element pair includes two GMR element 211', 213' with the second pinning direction 215'; the second sensing circuit 220 further includes a fourth element pair electrically connecting with the second element pair to form a second Wheatstone bridge circuit, and the fourth element pair also has two GMR elements 221', 223' with the first pinning direction 225'. The first Wheatstone bridge circuit is electrically connected with the second Wheatstone bridge circuit at their differential output terminals 214, 214' and 224, 224'. Similarly, it further has input terminals 212', 216', 222' and 226'.

In this embodiment, the potential output at output terminal 214 of the first element pair is $$V1 = Vcc \times \frac{\Delta R}{R};$$

the potential output at terminal 214' of the third element pair is $$V2 = -Vcc \times \frac{\Delta R}{R};$$

the potential output at output terminal 224 of the second element pair is $$V3 = -Vcc \times \frac{\Delta R}{R};$$

the potential output at output terminal 224' of the fourth element pair is $$V4 = Vcc \times \frac{\Delta R}{R}.$$

Thus, total deferential output of the first and second sensing circuits 210, 220 is $$V = (V1 - V2) - (V3 - V4) = 4Vcc \times \frac{\Delta R}{R}.$$

Similarly, if there is an external magnetic field with a direction indicated by 12 around or near the first and the second sensing circuits 210, 220 except the magnetic field generated by the current-carrying electrical conductor 28, noise outputs V1n, V3n, V2n and V4n also will be generated on the GMR elements on the first, second, third and fourth element pairs due to the external magnetic field affect. As explained in the first embodiment, V1n=V3n, V2n=V4n, thus the total noise signal deferential output V=(V1n−V2n)−(V3n−V4n)=0. Thus, this external noise will be automatic eliminated by the system that includes the first sensing circuit 210 and the second sensing circuit 220, thus the measurement accuracy to the current on the current-carrying electrical conductor 28 is improved with the external magnetic field affect eliminated.

Figure 8:
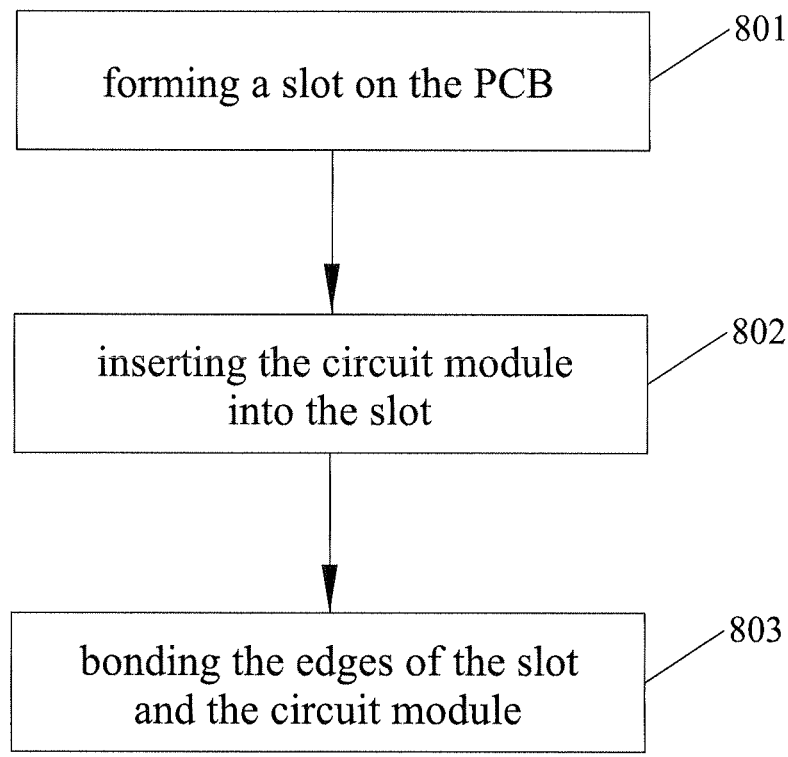
FIG. 8 is a flow chart of a method for bonding a circuit module to a printed circuit board according to one embodiment of the present invention.

FIG. 8 is a flow chart of a method for bonding a circuit module to a PCB according to one embodiment of the present invention. As shown, the method includes steps of:

Step (801), forming a slot on the PCB;
Step (802), inserting the circuit module into the slot; and
Step (803), bonding the edges of the slot and the circuit module.

Concretely, the step (803) further includes forming several first pads on the PCB; forming several second pads on the circuit module; and bonding the first pads and the second pads by soldering and or wire bonding, for example, so as to connect the circuit module and the PCB.

Preferably, the depth of the slot is the same with the thickness of the circuit module, so that the circuit module is on the same plane with the PCB.

Preferably, the slot maybe a through slot or a recessed slot to accommodate the circuit module.

Compared with the conventional bonding method, the present invention embeds the circuit module in the through slot or recessed slot formed on the PCB, thereby reducing the total height of the PCBA, which is propitious to the compact structure and design of the current electronic products.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. An electrical current sensor device comprising:
a first printed circuit board assembly;
a second printed circuit board assembly positioned opposite to the first printed circuit board assembly; and
a holder holding the first and second printed circuit board assemblies and providing a passage to allow an electrical conductor to pass through;
wherein the first printed circuit board assembly comprises a first sensing circuit having at least one first element pair that comprises two magnetoresistive elements with a first pinning direction, the second printed circuit board assembly comprises a second sensing circuit having at least one second element pair that comprises two magnetoresistive elements with a second pinning direction that is opposite to the first pinning direction, and the first and second pinning directions are perpendicular to a current direction of a current passing through the electrical conductor, the first sensing circuit electrically connects with the second sensing circuit.

2. The electrical current sensor device according to claim 1, wherein the first sensing circuit further comprises a third element pair electrically connecting with the first element pair, and the third element pair comprises two magnetoresistive elements with the second pinning direction; the second sensing circuit further comprises a fourth element pair electrically connecting with the second element pair, and the fourth element pair comprises two magnetoresistive elements with the first pinning direction.

3. The electrical current sensor device according to claim 1, wherein the first element pair and the second element pair are symmetrically located at two sides of the electrical conductor.

4. The electrical current sensor device according to claim 2, wherein the third element pair and the fourth element pair are symmetrically located at two sides of the electrical conductor.

5. The electrical current sensor device according to claim 1, wherein two slots are formed on the inner wall of the holder, and the first and second printed circuit boards are accommodated in the slots.

6. The electrical current sensor device according to claim 1, wherein a first through slot is formed through the first printed circuit board assembly, and a second through slot is formed through the second printed circuit board assembly, the first sensing circuit is packaged and embedded in the first through slot, and the second sensing circuit is packaged and embedded in the second through slot.

7. The electrical current sensor device according to claim 1, further comprising a shielding cover covering on the holder.

8. The electrical current sensor device according to claim 7, further comprising a display device formed on the shielding cover and electrically connects with the first and second printed circuit board assemblies.

* * * * *